(12) United States Patent
Zeller et al.

(10) Patent No.: US 11,732,973 B2
(45) Date of Patent: Aug. 22, 2023

(54) DEVICE FOR THE THERMAL TREATMENT OF TEST SAMPLES

(71) Applicant: Roche Molecular Systems, Inc., Pleasanton, CA (US)

(72) Inventors: Philipp Zeller, Sattel (CH); Sven Ebert, Zurich (CH); Stefan Vollenweider, Sins (CH)

(73) Assignee: Roche Molecular Systems, Inc., Pleasanton, CA (US)

( * ) Notice: Subject to any disclaimer, the term of this patent is extended or adjusted under 35 U.S.C. 154(b) by 673 days.

(21) Appl. No.: 16/704,743

(22) Filed: Dec. 5, 2019

(65) Prior Publication Data

US 2020/0182555 A1    Jun. 11, 2020

(30) Foreign Application Priority Data

Dec. 7, 2018   (EP) .................................... 18210943

(51) Int. Cl.
| | | |
|---|---|---|
| *C12Q 1/68* | (2018.01) | |
| *F28D 15/02* | (2006.01) | |
| *B01L 7/00* | (2006.01) | |
| *H01L 23/38* | (2006.01) | |
| *H01L 23/427* | (2006.01) | |
| *H10N 10/01* | (2023.01) | |

(52) U.S. Cl.
CPC ............ F28D 15/0233 (2013.01); B01L 7/52 (2013.01); H01L 23/38 (2013.01); H01L 23/427 (2013.01);
(Continued)

(58) Field of Classification Search
CPC ................... F28D 15/0233; B01L 7/52; B01L 2300/0829; B01L 2300/0627;
(Continued)

(56) References Cited

U.S. PATENT DOCUMENTS 9,149,809 B2 * 10/2015 Guo ......................... B01L 7/52
2006/0124280 A1   6/2006 Lee et al.
(Continued)

FOREIGN PATENT DOCUMENTS

CN      102052864 A     5/2011
EP      1710017 A1    10/2006
(Continued)

OTHER PUBLICATIONS

Escobar-Vargas et al. (2016, Hewlett-Packard Labs, HPE-2016-85, p. 2-34) (Year: 2016).*

(Continued)

*Primary Examiner* — Stephanie K Mummert
(74) *Attorney, Agent, or Firm* — Maneesh Gupta (57) ABSTRACT

A device for the thermal treatment of test samples is presented. The device comprises a sample holder and one or more thermoelectric elements which are in thermal contact with the sample holder. The sample holder comprises at least two holding positions configured to hold test sample consumables. The sample holder comprises an internal working fluid and a hollow body with an inner bottom surface and an inner top surface connected to each other with a pillar. The pillar extends along a vertical axis perpendicular to the inner bottom surface and substantially in the middle of the distance between the at least two holding positions. A laboratory instrument and a method for the thermal treatment of test samples is also presented.

15 Claims, 7 Drawing Sheets

(52) U.S. Cl.
CPC ...... *H10N 10/01* (2023.02); *B01L 2300/0829* (2013.01)

(58) Field of Classification Search
CPC ..... B01L 2300/1805; B01L 2300/1855; B01L 9/52; B01L 7/00; H01L 23/38; H01L 23/427; H01L 35/34; G01N 1/44
See application file for complete search history.

(56) References Cited

U.S. PATENT DOCUMENTS

2009/0120104 A1 5/2009 Federer
2014/0311706 A1 10/2014 Tenzler et al.

FOREIGN PATENT DOCUMENTS

| EP | 2060324 A1 | 5/2009 |
| EP | 3290119 A1 | 3/2018 |
| EP | 3300801 A1 | 4/2018 |
| WO | 2012154453 A1 | 11/2012 |
| WO | WO2013075839 A2 | 5/2013 |

OTHER PUBLICATIONS

Extended Search Report dated Mar. 7, 2019 for EP18210943.9.
LIU_WANGYU_ET_AL_2018, The experimental investigation of a vapor chamber with compound cols. under the influence of gravity, Applied Thermal Engineering, May 5, 2018, 131-138, 140, Applied Thermal Engineering, CN.

* cited by examiner

DEVICE FOR THE THERMAL TREATMENT OF TEST SAMPLES

CROSS-REFERENCE TO RELATED APPLICATIONS

This application claims the benefit and priority of European Application Serial No. 18210943.9, filed Dec. 7, 2018, which is incorporated herein by reference.

FIELD OF THE DISCLOSURE

The present disclosure belongs to the field of in vitro diagnostic test sample treatment and analysis. Within this field, it relates to a device, a laboratory instrument, and a method for the thermal treatment of test samples.

BACKGROUND

In diagnostic laboratories test samples are processed and analysed on laboratory instruments such as pre-analytical, analytical, and post-analytical instruments. Typically, such laboratory instruments comprise means for performing thermal treatments or temperature-dependent reactions of test samples within test sample consumables. During temperature-dependent reactions performed on an analytical instrument, the presence and if desired the concentration of an analyte or parameter of a test sample can be determined. For this purpose, a test sample consumable comprising a test sample is placed in a sample holder which can be heated and/or cooled to predefined temperatures or set-point temperatures according to a temperature profile of a test protocol. The quality of such a temperature-dependent reaction and the resulting analysis depends on the accurate heating and/or cooling of the sample holder and test sample. In particular, for a quantitative analysis of an analyte during a temperature-dependent reaction such as a nucleic acid amplification reaction a reliable execution of a temperature profile on the sample holder in a thermocycler instrument is essential. Inaccurate temperatures of the sample holder may lead to incorrect (elevated or lowered) test results or worst case to false negative or false positive test results causing misinterpretation of test results, inappropriate further testing, and initiation of treatments with potentially hazardous outcomes for the patient.

For an efficient and simultaneous thermal treatment of multiple test samples sample holders may comprise multiple recesses or placing areas for inserting or placing multiple test sample consumables each containing a test sample. For a comparable quantitative analysis of all treated test samples each test sample has to be exposed to a substantially same temperature(s) for the same time duration. Accordingly, a sample holder should have a high temperature uniformity so that after heating and/or cooling of the sample holder, the temperature is uniformly or equally distributed over the sample holder within shortest time.

U.S. Pat. No. 9,149,809B2 and EP1710017A1 describe sample holders comprising vapor chambers for achieving a high temperature uniformity of the sample holder. A vapor chamber is a special heat pipe for transporting and distributing heat. The term heat pipe is an established name for a sealed vacuum vessel with an inner wick structure that transfers heat by the evaporation and condensation of an internal working fluid. As heat is absorbed at one side of the heat pipe (evaporator section), the internal working fluid is vaporized, creating a pressure gradient within said heat pipe. The vapor is forced to flow to the cooler end of the heat pipe (condenser section), where it condenses and dissipates its latent heat to the ambient environment. The condensed internal working fluid returns to the evaporator section via gravity and/or capillary action within the inner wick structure.

As the pace or time duration to reach a uniform temperature of the sample holder and the thermal uniformity of the sample holder as such depends on an efficient internal working fluid return, it was an object of the present disclosure to improve conventional sample holders for the thermal treatment of test samples, particularly to better serve the needs of automated in vitro diagnostic test sample treatments.

SUMMARY

The present disclosure pertains to a device, a laboratory instrument, and a method for the thermal treatment of test samples.

The present disclosure relates to a device for the thermal treatment of test samples. The device comprises a sample holder and one or more thermoelectric elements. The sample holder comprises a hollow body with an inner bottom surface and an inner top surface opposite to each other. The hollow body comprises an internal working fluid. The sample holder further comprises an outer top surface parallel to the inner top surface. The inner bottom surface and the inner top surface are connected to each other with a pillar extending along a vertical axis perpendicular to the inner bottom surface. The outer top surface comprises at least two holding positions each configured to hold a test sample consumable or a part of a test sample consumable. The vertical axis is substantially in the middle of the distance between the at least two holding positions. And the one or more thermoelectric elements are in thermal contact with the hollow body.

The present disclosure also relates to a laboratory instrument for performing thermal treatment of test samples. The laboratory instrument comprises a device for the thermal treatment of test samples as disclosed herein and a control device. The control device is configured to control the one or more thermoelectric elements in order to heat or cool the sample holder.

The disclosure further relates to a method of performing thermal treatment on test samples in a device for the thermal treatment of test samples as disclosed herein or in a laboratory instrument for performing thermal treatment of test samples as disclosed herein. The method comprises exposing a test sample to one or more predefined temperatures by operating the one or more thermoelectric elements, wherein the test sample is in a test sample consumable held by one of the at least two sample holding positions.

DETAILED DESCRIPTION

The present disclosure relates to a device for the thermal treatment of test samples. The device comprises a sample holder and one or more thermoelectric elements. The sample holder comprises a hollow body with an inner bottom surface and an inner top surface opposite to each other. The hollow body comprises an internal working fluid. The sample holder further comprises an outer top surface parallel to the inner top surface. The inner bottom surface and the inner top surface are connected to each other with a pillar extending along a vertical axis perpendicular to the inner bottom surface. The outer top surface comprises at least two holding positions each configured to hold a test sample consumable or a part of a test sample consumable. The vertical axis is substantially in the middle of the distance between the at least two holding positions. And the one or more thermoelectric elements are in thermal contact with the hollow body.

As used herein, the term "thermal treatment" relates to a pre-analytical, analytical or post-analytical test sample processing step for heating and/or cooling a test sample to a predefined test sample temperature and to keep the test sample temperature at the predefined test sample temperature for a predefined time duration. Thus, the thermal treatment of a test sample may be an incubation of a test sample at a certain temperature for a certain time duration, a storage condition of a test sample at a certain storage temperature for a certain time duration, or a temperature-dependent reaction of a test sample.

A temperature-dependent reaction of a test sample relates to a reaction or process for developing a detectable signal associated with an analyte or analyte-related parameter of a test sample under predefined temperature conditions. Typically, a test sample is mixed with a test reagent. Subsequently, the test sample/reagent mixture is heated and/or cooled to and kept at a predefined test sample temperature which may be associated with a predefined set-point temperature of a temperature profile for a predefined time duration. The test reagent comprises a substance or solution that reacts with an analyte or analyte-related substance for developing a detectable signal, wherein the test sample temperature supports or enables the reaction. Non-limiting examples of temperature dependent-reactions are chemical test reactions, immunological test reactions, enzymatic test reactions, molecular biological test reactions, dye stainings, coagulation test reactions, agglutination test reactions.

A temperature profile of a temperature-dependent reaction relates to a predefined temporal course of set-point temperatures to which the sample holder is heated/cooled or at which the sample holder temperature is maintained for a predefined time duration so that a test sample is heated/cooled to a predefined test sample temperature or at which the test sample temperature is maintained for the predefined time duration. The temperature profile comprises at least one predefined set-point temperature to which the sample holder is heated or cooled for a predefined time duration and at a predefined time point. The execution of a temperature profile on a sample holder comprises heating or cooling of the sample holder to the at least one set-point temperature for a predefined time duration at a predefined time point using one or more thermoelectric elements controlled by a control device. Thus, the execution of the temperature profile may comprise heating or cooling of the sample holder at a predefined time point for reaching a predefined set-point temperature and heating or cooling of the sample holder for maintaining the sample holder temperature at the reached predefined set-point temperature for a predefined time duration. The set-point temperature may be a temperature at which certain sample processing steps such as pre-analytical, analytical or post-analytical sample processing steps are supported or enabled. For example, certain temperature-dependent reactions such as chemical reactions, enzymatic reactions, or microbiological reactions may take place only at certain temperatures or may be more efficient at certain temperatures.

In one embodiment, the temperature profile may comprise only one set-point temperature. For example, the sample holder is heated by the one or more thermoelectric elements to a predefined set-point temperature (e.g. 95° C.) for a predefined time duration (e.g. 10 Seconds) at a predefined time point. And afterwards, the sample holder cools down to room temperature without the support of the one or more thermoelectric elements.

In another embodiment, the temperature profile may comprise two set-point temperatures. For example, the sample holder is heated by the one or more thermoelectric elements to a first predefined set-point temperature (e.g. 37° C.) for a first predefined time duration (e.g. 3 hours) at a first predefined time point. During the first predefined time duration a temperature-dependent reaction may take place. Afterwards, at a second predefined time point (e.g. after the first predefined time duration) the sample holder is cooled by the one or more thermoelectric elements to a second predefined set-point temperature (e.g. 4° C.) for a predefined time duration (e.g. 24 hours).

In a further embodiment, the temperature profile comprises three or more set-point temperatures. For example, the sample holder is heated by the one or more thermoelectric elements to a first predefined set-point temperature (e.g. 95° C.) for a first predefined time duration (e.g. 30 seconds) at a first predefined time point. Then, the sample holder is cooled by the one or more thermoelectric elements to a second predefined set-point temperature (e.g. 65° C.) for a second predefined time duration (e.g. 30 seconds) at a second predefined time point (e.g. after the first time duration). Subsequently, the sample holder is heated by the one or more thermoelectric elements to a third predefined set-point temperature (e.g. 72° C.) for a third predefined time duration (e.g. 2 minutes) at a third predefined time point (e.g. after the second time duration). The sequence of the first predefined set-point temperature for the first time duration, the second predefined set-point temperature for the second time duration, and the third predefined set-point temperature for the third time duration may define a cycle of the temperature profile during which one or multiple temperature-dependent reactions may take place. And during the execution of the temperature profile this cycle of the temperature profile may be repeated multiple times (e.g. forty times) before the sample holder is cooled by the one or more thermoelectric elements to a fourth predefined set-point temperature (e.g. 4° C.) for a predefined time duration (e.g. 24 hours) at a fourth predetermined time point (e.g. after the third time duration of the last cycle of the temperature profile). Such a temperature profile may be executed on the sample holder for conducting a nucleic acid amplification reaction as further described below.

As used herein, the term "test sample" relates to a patient's specimen (e.g. serum, plasma, whole blood, urine, stool, sputum, cerebrospinal fluid, bone marrow, tissue etc.) from which the presence and if desired the concentration of an analyte or parameter of interest can be determined using a temperature dependent-reaction. As a test sample is taken from an individual patient at a certain time, corresponding analytes or parameters of interest are unique for each test sample.

As used herein, the term "sample holder" relates to a means adapted for receiving, holding, and/or releasing at least one test sample consumable containing a test sample and/or a test reagent. The sample holder comprises a hollow body with an inner bottom surface and an inner top surface opposite to each other. The hollow body may be made of a metal such as copper, aluminum, silver, or gold. The metal may be a sintered metal. Alternatively, the hollow body may be made of a copper alloy, aluminum alloy, silver alloy, or gold alloy. The alloy may be a sintered alloy. The hollow body may have a cubic shape. The hollow body comprises an internal working fluid. The evaporation and the condensation of the internal working fluid inside the hollow body are used to transfer heat from one to the other of the inner surfaces of the hollow body. For example, the inner bottom surface of the hollow body may be the evaporator section where heat is provided by the one or more thermoelectric elements and absorbed at the inner bottom surface. The internal working fluid is vaporized and a pressure gradient within the hollow body may be created. And the inner top surface of the hollow body may be the condenser section to which the vapor is forced to flow, where it condenses and dissipates its heat to the outer top surface of the hollow body and then to the test sample consumable. Subsequently, the condensed internal working fluid returns to the inner bottom surface via gravity or capillary action.

The sample holder further comprises an outer top surface parallel to the inner top surface. The outer top surface comprises at least two holding positions each configured to hold a test sample consumable or a part of a test sample consumable.

In one embodiment, the outer top surface comprises a recess or a placing area at each of the at least two holding positions. And each recess or placing area is configured to receive, accommodate, and release a test sample consumable or a part of a test sample consumable in a manner that heat exchange between the sample holder and the test sample consumable can be facilitated. The geometry or the shape of the recess or placing area may be adapted to the geometry or shape of the test sample consumable enabling an optimal bidirectional heat flux between the sample holder and the test sample consumable. The recess may have a cylindrical, conical or cubic shape. The placing area may have a flat surface with protrusions forming a frame for an accurate and reliable placing of a test sample consumable. Alternatively, protrusions of multiple placing areas may form a common frame for the accurate and reliable placing of a test sample consumable.

As used herein, the term "test sample consumable" relates to a means adapted for receiving, storing, transporting, and/or releasing a content such as a test sample (e.g. blood, urine, serum, plasma, or liquefied biopsy sample, tissue, etc.), a test reagent (e.g. reagent for immunochemistry tests, clinical chemistry tests, coagulation tests, hematological tests, molecular biological tests, dye staining, etc.), or a combination thereof. Depending on the content of the test sample consumable, sample processing step or thermal treatment of the test sample, and manufacturer of the material as well as the dimension of the test sample consumable like diameter, side length, height and geometry varies.

In a specific embodiment, the test sample consumable is a test sample vessel configured to be received by the recess, wherein the test sample vessel is configured to receive, store, transport, and release a test sample. The sample vessel may be a vessel with a cylindrical, conical or cubic shape. The sample vessel may have a closed bottom and an open top. The closed bottom of the cylindrical vessel can be rounded and the open top may be closable, e.g. by using a cap. A non-limiting example of a single cylindrical or conical separation vessel is a primary or secondary sample vessel which is well known in the art. Alternatively, two or more sample vessels may be arranged as a multi test sample vessel assembly configured to be received by multiple recesses of the sample holder. A non-limiting example of such a multi test sample vessel assembly is a multiwell plate which is well known in the art.

In another specific embodiment, the test sample consumable is a microfluidic device configured to be received by the placing area, wherein the microfluidic device is configured to receive, store, transport, and release a test sample. The microfluidic device may comprise at least one flow channel in fluid communication with an array of wells which are intended as reaction chambers for temperature-dependent reactions of at least one test sample. A microfluidic device may be designed as described in EP3300801A1 reference number 1 in FIG. 1 and corresponding description.

In a further specific embodiment, the test sample consumable is a test sample carrier configured to be received by the placing area, wherein the test sample carrier is configured to receive, store, transport, and release a test sample. The test sample carrier may be a small flat rectangular piece of glass or plastic on which one or more test samples can be positioned for analysis. A non-limiting example of a test sample carrier is a microscope slide on which one or more tissue sections can be mounted for dye staining and subsequent imaging or microscopic studies. The microscope slide may further comprise a coverslip positioned on the microscope slide.

The inner bottom surface and the inner top surface of the hollow body are connected to each other with a pillar extending along a vertical axis perpendicular to the inner bottom surface. And the vertical axis is substantially in the middle of the distance between the at least two holding positions. Thus, the pillar is positioned between the at least two holding positions within the scope of general manufacturing accuracies. Because tempered test samples comprise a thermal mass, the internal working fluid condenses first on the inner top surface at the pillar position in case test sample consumables with tempered test samples are held by the at least two holding positions. Accordingly, a pillar which connects the inner bottom surface and inner top surface between the at least two holding positions may improve the internal working fluid return, and therefore, the pace or time to reach a uniform temperature of the sample holder.

As used herein, the term "pillar" relates to a vertical structure connecting the inner bottom surface and the inner top surface of the hollow body for a guided and efficient return of the condensed internal working fluid from one to the other of the inner surfaces of the hollow body. The condensed internal working fluid may return from the inner top surface to the inner bottom surface via capillary action and supported by gravity. Furthermore, the pillar may have a supporting function and contribute to the stability of the hollow body. Depending on the design of the hollow body, the geometry and arrangement of the recesses or placing areas, the dimension of the pillar like diameter, side length, height and geometry varies. In one embodiment, the pillar comprises a cylindrical shape. Alternatively, the pillar may have a conical or cubic shape. The pillar may be solid or hollow.

In a further embodiment, the pillar comprises a surface with axial grooves. The axial grooves may extend over the surface in a vertical and parallel manner or in a spiral. The axial grooves may increase the pillar surface and therefore may contribute to a more efficient return of the internal working fluid.

In one embodiment, the pillar comprises a wick structure. The wick structure may consist of capillaries, narrow spaces, pores, or a lattice structure to move the working liquid from the inner top surface (condenser section) to the inner bottom surface of the hollow body (evaporator section). Thus, the wick structure supports the capillary action of the pillar and enables the working liquid to flow without the assistance of external forces like gravity. The wick structure may be constructed from various material and methods.

In a specific embodiment of the pillar, the wick structure is a porous structure. Thus, the pillar may be made of a porous material comprising pores. The pores are minute openings or interstices of any kind admitting an efficient absorption or passage of the internal working fluid. Accordingly, the pores may further improve the capillary action of the pillar.

In a more specific embodiment, the porous structure is made of sintered metal or sintered alloy. As used herein, the terms "sintered metal" or "sintered alloy" relate to a solid product made through the process of powder metallurgy from different types of metals and alloys. For example, the porous structure of the pillar may be made of sintered copper, sintered aluminum, sintered silver, sintered gold, sintered copper alloy (e.g. bronze, brass, etc.), sintered aluminum alloy, sintered silver alloy, or sintered gold alloy.

In one embodiment, the pillar is an assembly of two or more sub-pillars. The inner bottom surface and the inner top surface of the hollow body are connected to each other by each sub-pillar of the assembly. The assembly comprises a horizontal circumference and a further vertical axis perpendicular to the inner bottom surface and in the center of the horizontal circumference. The sub-pillars are arranged within or along the horizontal circumference of the assembly. And the further vertical axis is aligned with the vertical axis. Each sub-pillar may comprise a wick structure. Each sub-pillar may comprise a cylindrical shape. Each sub-pillar may further comprise a surface with axial grooves. The wick structure of each sub-pillar may be a porous structure made of sintered metal or alloy. The wick structure of each sub-pillar may improve the total capillary action of the pillar. The horizontal circumference of the assembly may have any geometrical form (e.g. circle, triangle, square, etc.) and the sub-pillars may be arranged symmetrically or asymmetrically order within or along the horizontal circumference. In one embodiment, multiple sub-pillars may be arranged in an equidistant manner along the horizontal circumference. Optionally, a sub-pillar may be positioned in the center of horizontal circumference. The assembly is positioned between the at least two holding positions within the scope of general manufacturing accuracies. Because tempered test samples comprise a thermal mass, the internal working fluid condenses first on the inner top surface and in the center of the assembly in case test sample consumables with tempered test samples are held by the at least two holding positions.

Accordingly, an assembly which connects the inner bottom surface and inner top surface with multiple sub-pillars between the at least two holding positions may further improve the internal working fluid return, and therefore, the pace or time to reach a uniform temperature of the sample holder.

In a further specific embodiment, the pillar is a 3D printing product. The term "3D printing product" as used herein relates to a solid product made through the process of 3D printing. 3D printers can produce a virtually free-formable pillar from a filament consisting of metals, alloys, sintered metals, or sintered alloys.

In one embodiment of the device, the hollow body is made of a first metal, first sintered metal, first alloy, or first sintered alloy. The pillar is made of a second metal, second sintered metal, second alloy, or second sintered alloy. And the first metal, first sintered metal, first alloy, or first sintered alloy and the second metal, second sintered metal, second alloy, or second sintered alloy are the same or different.

In a specific embodiment, the first metal or first sintered metal is copper, aluminum, silver, or gold. The first alloy or first sintered alloy is a copper alloy, aluminum alloy, silver ally, or gold alloy. The second metal or second sintered metal is copper, aluminum, silver, or gold. And the second alloy or second sintered alloy is a copper alloy, aluminum alloy, silver alloy, or gold alloy. As a non-limiting example, the hollow body may be made of aluminum or an aluminum alloy and the pillar may be made of sintered copper or a sintered copper alloy. That way, both, weight and cost of the hollow body can be reduced to a minimum by maximizing the efficiency of the heat spreading function of the hollow body. As the pillar is expected to contain less volume than the outer walls of the hollow body, only the pillar may be made of the more expensive and heavier sintered copper or sintered copper alloy. However, copper has a slightly better heat conductivity than aluminum. And a pillar made out of copper or a copper alloy may further improve the heat spreading in addition to the inner working fluid.

In one embodiment, the hollow body and the pillar consist of one single piece, wherein said single piece is a 3D printing product. Accordingly, there are no gaps or splits between the pillar and the inner bottom/top surfaces of the hollow body which allows an efficient internal working fluid return. Additionally, the tightness of the hollow body may be ensured as no leaky weld seams occur during manufacturing the hollow body. 3D printers can produce a single piece comprising the same or different metals, alloys, sintered metals, or sintered alloys for the pillar and the hollow body.

In an alternative embodiment, the hollow body consists of a hollow body top part comprising the inner top surface and a hollow body bottom part comprising the inner bottom surface. The pillar consists of a pillar top part and a pillar bottom part. The pillar top part is comprised by the hollow body top part and the pillar bottom part is comprised by the hollow body bottom part. And the hollow body top part is fixed on the hollow body bottom part to form the hollow body and the pillar. For example, the hollow body top part may be fixed on the hollow body bottom part by any suitable means (e.g. by welding) so that a tight hollow body is produced. Whereas the pillar top part may be connected to the pillar bottom part by a locking mechanism. As a non-limiting example of such a locking mechanism, the pillar top part may comprise a pin which fits into a pin hole of the pillar bottom part.

In a more specific embodiment, the pillar top part is attached or mounted on the inner top surface of the hollow body top part by any suitable means (e.g. by soldering, welding, gluing, pressure fixation like clamping, or screwed) so that the pillar top part is in direct contact with the inner top surface of the hollow body. And the pillar bottom part is attached or mounted on the inner bottom surface of the hollow body by any suitable means (e.g. by soldering, welding, gluing, pressure fixation like clamping, or screwed) so that the pillar bottom part is in direct contact with the inner bottom surface of the hollow body.

In another specific embodiment, the hollow body top part and the pillar top part consist of one single piece and the hollow body bottom part and the pillar bottom part consist of another single piece. And both single pieces are a 3D printing products which may be fixed together to form the hollow body and the pillar by any suitable means (e.g. by welding).

In one embodiment, the outer top surface is comprised by the hollow body, wherein the shape of the inner top surface is adapted to the outer top surface. Thus, the sample holder may consist only of the hollow body. And the recesses or the placing areas for the test sample consumables may be comprised or formed by the outer top surface and inner top surface of the hollow body.

In one embodiment, the sample holder further comprises a thermal block and the outer top surface is comprised by the thermal block. The hollow body is substantially planar and the thermal block is located on the hollow body. Thus, the sample holder may be an assembly comprising a hollow body and a thermal block. The thermal block may have a cubic shape and may comprise one or multiple recesses or placing areas. And each recess or placing area is configured to receive, accommodate, and release a test sample consumable or a part of a test sample consumable in a manner that heat exchange between the sample holder and the test sample consumable can be facilitated. In one embodiment, the thermal block is made out of copper, aluminum, silver, copper alloy, aluminum alloy, silver alloy, or gold alloy. The thermal block may be in direct thermal contact with the hollow body having a substantially planar shape.

The thermal block and the hollow of the sample holder may be designed as described in EP1710017A1, reference numbers 1, 4 and 6 in FIG. 1 and corresponding description.

In a specific embodiment, the thermal block is mounted on the hollow body. For example, the thermal block is attached at the outer top surface of the hollow body by any suitable means, such as for example glue or mechanical fastener elements (e.g. screws) so that the thermal block is in direct contact with the outer top surface of the hollow body for an efficient bi-directional heat flux.

In another specific embodiment, the hollow body and the thermal block consist of one single piece, wherein said single piece is a 3D printing product. As there are no gaps or splits between the hollow body and the thermal block, the efficiency of the bi-directional heat flux between the hollow body and the thermal block may be improved. 3D printers can produce a single piece comprising the same or different metals, alloys, sintered metals, or sintered alloys for the thermal block and the hollow body. Alternatively, the hollow body top part as described above comprises the thermal block.

The device further comprises one or more thermoelectric elements which are in thermal contact with the hollow body. As used herein, the term "thermoelectric element" relates to a device for heating and/or active cooling of the sample holder. Thus, the one or more thermoelectric elements are used as a temperature controller that either heats or cools the sample holder to at least one predefined temperature or set-point temperature of a temperature profile. Thermoelectric elements are solid-state heat pumps made from semiconductor materials comprising a series of p-type and n-type semiconductor pairs or junctions sandwiched between ceramic plates or other insulating materials. Heat is absorbed by electrons at the cold junction as they pass from a low energy level in a p-type element to a higher energy level in an n-type element. At the hot junction, energy is expelled to e.g. a heat sink as the electrons move from the high-energy n-type element to a low-energy p-type element. A dc power supply provides the energy to move the electrons through the system. The amount of heat pumped is proportional to the amount of current flowing through the thermoelectric element and therefore, tight temperature control is possible. By reversing the current, thermoelectric elements can function as heaters or coolers, which can be useful in controlling the execution of a temperature profile on a sample holder. Because of the relatively large amount of heat being pumped over a small area, thermoelectric elements in general may require a heat sink to dissipate the heat into the ambient environment. A well-known type of thermoelectric elements is the Peltier elements.

In a specific embodiment, the one or more thermoelectric elements comprise one or more electrodeposited thermoelectric elements. An electrodeposited thermoelectric element relates to a thermoelectric element made or manufactured by electrodeposition of the p-type and n-type elements. Electrodeposition is a processes which includes electrocoating, e-coating, cathodic electrodeposition, anodic electrodeposition, and electrophoretic coating, or electrophoretic painting. A characteristic feature of this process is that colloidal particles suspended in a liquid medium migrate under the influence of an electric field (electrophoresis) and are deposited onto an electrode. All colloidal particles that can be used to form stable suspensions and that can carry a charge can be used in electrophoretic deposition. This includes materials such as polymers, pigments, dyes, ceramics, silicates, metalloids (=semimetals) and metals. The process is useful for applying materials to any electrically conductive surface. As electrodeposition enables a highly granular arrangement of the p-type and n-type elements electrodeposited thermoelectric element have a high flexibility and may be individually shaped with rather low effort. An electrodeposited thermoelectric element may be designed as described in EP3290119A1 reference number 48 in FIGS. 1 to 8 and corresponding description.

In one embodiment, the device further comprises a heat sink which is in thermal contact with the one or more thermoelectric elements. The one or more thermoelectric elements may be disposed between the sample holder and the heat sink. Thus, heat may be removed from the sample holder and transferred to the heat sink which dissipates the heat into the ambient environment. A heat sink may be designed as described in EP3290119A1 reference number 30 in FIGS. 1, 2, 3, 4, 6, 7, 8 and corresponding description.

In a more specific embodiment, the heat sink is a further hollow body. The further hollow body may comprise a further inner bottom surface and a further inner top surface opposite and parallel to each other. The further hollow body may be made of a metal such as copper, aluminum, silver, or gold. Alternatively, the further hollow body may be made of a copper alloy, aluminum alloy, solver alloy, or gold alloy. The metal may be a sintered metal and the alloy may be a sintered alloy. The further hollow body may have a cubic shape. The further hollow body may comprise a further internal working fluid. The evaporation and the condensation of the further internal working fluid inside the further hollow body are used to transfer heat from one to the other of the further inner surfaces of the further hollow body. For example, when heat provided by the one or more thermoelectric elements is absorbed at the further inner top surface of the further hollow body (evaporator section of the further hollow body), the internal working fluid is vaporized, creating a pressure gradient within the further hollow body. The vapor is forced to flow to the cooler further inner bottom surface of the hollow body (condenser section of the hollow), where it condenses and dissipates its heat to the ambient environment.

In one embodiment, the further inner top surface and the further inner bottom surface of the further hollow body may be connected to each other with a further pillar. The pillar and the further pillar may extend along the same or along a different vertical axis perpendicular to the inner bottom surface and further inner bottom surface. The further pillar may comprise a wick structure and a cylindrical shape. The further pillar may further comprise a surface with axial grooves. The wick structure may be a porous structure made of sintered metal or alloy. The wick structure may support the capillary action of the further pillar and enables the working liquid to flow from the further inner bottom surface to the further inner top surface without the assistance of, or even in opposition to gravity. As the heat is uniformly distributed on the further hollow body, the heat can also be dissipated evenly and thus efficiently to the environment which improves the efficiency of the cooling.

In one embodiment, the further pillar may be a further assembly of two or more further sub-pillars. The further inner bottom surface and the further inner top surface of the further hollow body may be connected to each other by each further sub-pillar of the further assembly. The further assembly may comprise a further horizontal circumference and an additional vertical axis perpendicular to the further inner bottom surface and in the center of the further horizontal circumference. The further sub-pillars may be arranged within or along the further horizontal circumference of the further assembly. And the additional vertical axis may be aligned with the vertical axis. Each further sub-pillar may comprise a wick structure. Each further sub-pillar may comprise a cylindrical shape. Each further sub-pillar may further comprise a surface with axial grooves. The wick structure of each further sub-pillar may be a porous structure made of sintered metal or alloy. The wick structure of each sub-pillar may improve the total capillary action of the further pillar. The further horizontal circumference of the further assembly may have any geometrical form (e.g. circle, triangle, square, etc.) and the further sub-pillars may be arranged symmetrically or asymmetrically order within or along the further horizontal circumference. In one embodiment, multiple further sub-pillars may be arranged in an equidistant manner along the further horizontal circumference. Optionally, a further sub-pillar may be positioned in the center of the further horizontal circumference.

The present disclosure also relates to a laboratory instrument for performing thermal treatment of test samples. The laboratory instrument comprises a device for the thermal treatment of test samples as disclosed herein and a control device. The control device is configured to control the one or more thermoelectric elements in order to heat or cool the sample holder.

As used herein, the term "laboratory instrument" relates to any pre-analytical, analytical or post-analytical instrument configured to process or treat a test sample according to predefined temperatures or temperature profiles of a temperature profile. A pre-analytical instrument can usually be used for the preliminary processing or treatment of test samples. An analytical instrument can be designed, for example, to use a test sample or part of the test sample and a test reagent in order to produce a measurable signal, on the basis of which it is possible to determine whether the analyte is present, and if desired in what concentration. A post-analytical instrument can usually be used for the post-processing or treatment of test samples like the archiving of test samples at certain temperature conditions. The laboratory instrument may comprise, for example, at least one device from the group of following devices: a sorting device for sorting test samples or test sample consumables, a cap removal device for removing caps or closures on sample vessels, a cap fitting device for fitting caps or closures on sample vessels, a cap removal/fitting device for removing/fitting caps or closures on sample vessels, a pipetting device for pipetting a test sample and/or test reagent, an aliquoting device for aliquoting test samples and/or test reagents, a centrifuging device for centrifuging test samples and/or test reagents, one or more thermoelectric elements for heating and/or cooling a sample holder, a sample holder for holding a test sample consumable containing a test sample and/or test reagent, a mixing device for mixing a test sample and/or test reagent, an isolation device for isolating an analyte of the test sample, a storing device for storing test samples and/or test reagents, an archiving device for archiving test samples and/or test reagents, a test sample consumable type determination device for determining a test sample consumable type, a test sample quality determination device for determining a test sample quality, a test sample consumable identification device for identifying a test sample consumable, a detection device for detecting an analyte of a test sample. Such laboratory instruments are well known in the art.

The term "control device" as used herein encompasses any physical or virtual processing device comprising a processor which is configured to control the laboratory instrument in a way that test sample processing steps are conducted by the laboratory instrument. The processor of the control device may, for example, instruct the laboratory instrument to conduct pre-analytical, post-analytical and analytical test sample processing steps. The control device may receive information from a data management unit regarding which steps need to be performed with a certain test sample. The processor of the control device may, for instance, be embodied as a programmable logic controller adapted to execute a computer-readable program provided with instructions to perform operations of the laboratory instrument. One example of such an operation is to control one or more thermoelectric elements in order to heat or cool the sample holder to at least one predefined temperature or set-point temperature of a temperature profile for a predefined time duration and at a predefined time point.

In one embodiment, the laboratory instrument further comprises a light source configured to emit light towards the at least two holding positions and a detector configured to detect light emitted from the at least two holding positions. Thus, the light source is configured to emit light towards the at least two holding positions so that a test sample in a test sample consumable may be illuminated. As non-limiting examples the light source may be a light-emitting diode (LED), a halogen lamp, a xenon lamp, or a laser. The emitted light towards the at least two holding positions may interact with an analyte, analyte-related parameter, or analyte-related substance of the test sample resulting in a light emitted from the at least two holding positions. As non-limiting examples the interaction between the emitted light and the analyte, analyte-related parameter, or analyte-related substance may be based on reflection, scattering, absorption including fluorescence, luminescence, refraction, optical activity, and photoelectric effect. The intensity of the light emitted from the at least two holding positions may be measured by the detector. As non-limiting examples, the detector comprises a single photodiode, an array of photodiodes, a charge-coupled device (CCD), a complimentary metal-oxide semiconductor (CMOS) sensor or a photomultiplier tube (PMT) or an array thereof. Based on the measured light intensity a test result for the analyzed test sample may be calculated. And the test result may indicate the presence and/or the concentration of an analyte, analyte-related parameter, or analyte-related substance in the test sample.

In one embodiment, the thermal treatment of test samples performed by the laboratory instrument is a temperature-dependent reaction.

In a more specific embodiment, the thermal treatment of test samples performed by the laboratory instrument is a nucleic acid amplification reaction. As used herein, the term "nucleic acid amplification reaction" relates to a method or reaction used in molecular biology to amplify a single copy or a few copies of a DNA segment to a detectable amount of copies of the DNA segment involving repeated temperature-dependent reactions with a polymerase. One such temperature-dependent reaction may take place during the execution of one cycle of a temperature profile on the sample holder. And each cycle of the temperature profile may comprise at least three discrete set-point temperatures. For example, each cycle of the temperature profile may comprise a first set-point-temperature and a first time duration for the denaturation phase (e.g. 95° C. for 30 seconds), a second set-point-temperature and a second time duration for the annealing phase (e.g. 65° C. for 30 seconds), and a third set-point-temperature and a third time duration for the extension phase (e.g. 72° C. for 2 minutes) of the nucleic acid amplification reaction. Typically, a temperature profile of a nucleic acid amplification reaction consists of 20-40 repeated cycles until a detectable amount of copies of the DNA segment is generated. The detection of the copies of the DNA segment can be done after the nucleic acid amplification reaction is completed or during the nucleic acid amplification reaction in real-time.

The disclosure further relates to a method of performing thermal treatment on test samples in a device for the thermal treatment of test samples as disclosed herein or in a laboratory instrument for performing thermal treatment of test samples as disclosed herein. The method comprises exposing a test sample to one or more predefined temperatures by operating the one or more thermoelectric elements, wherein the test sample is in a test sample consumable held by one of the at least two sample holding positions.

Figure 1A:
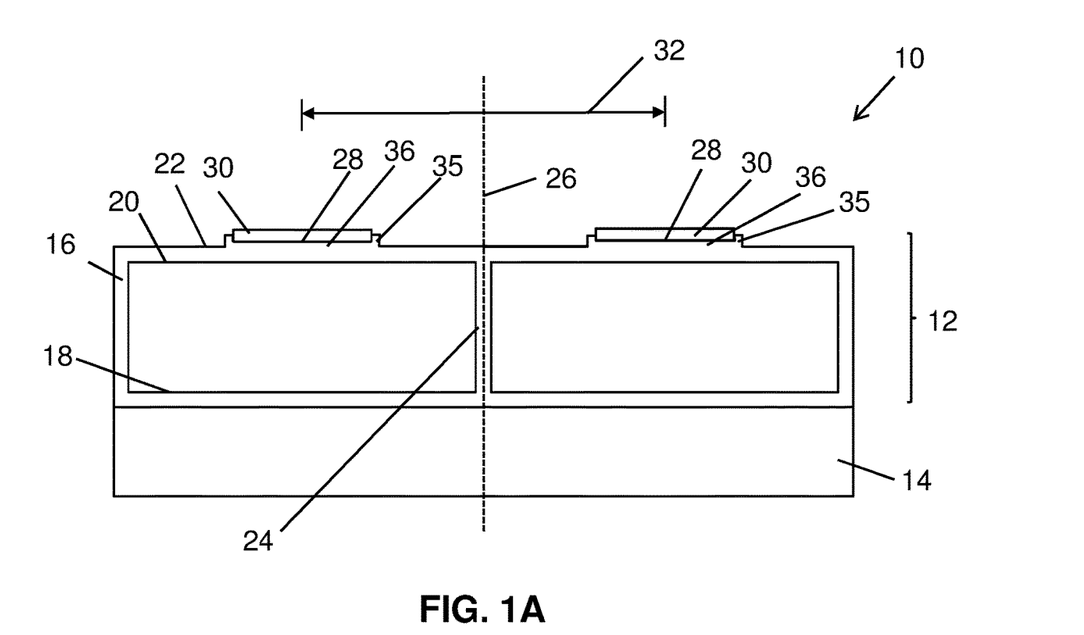
FIGS. 1A-1B show an embodiment of a device for the thermal treatment of test samples according to the present disclosure.
Figure 1B:
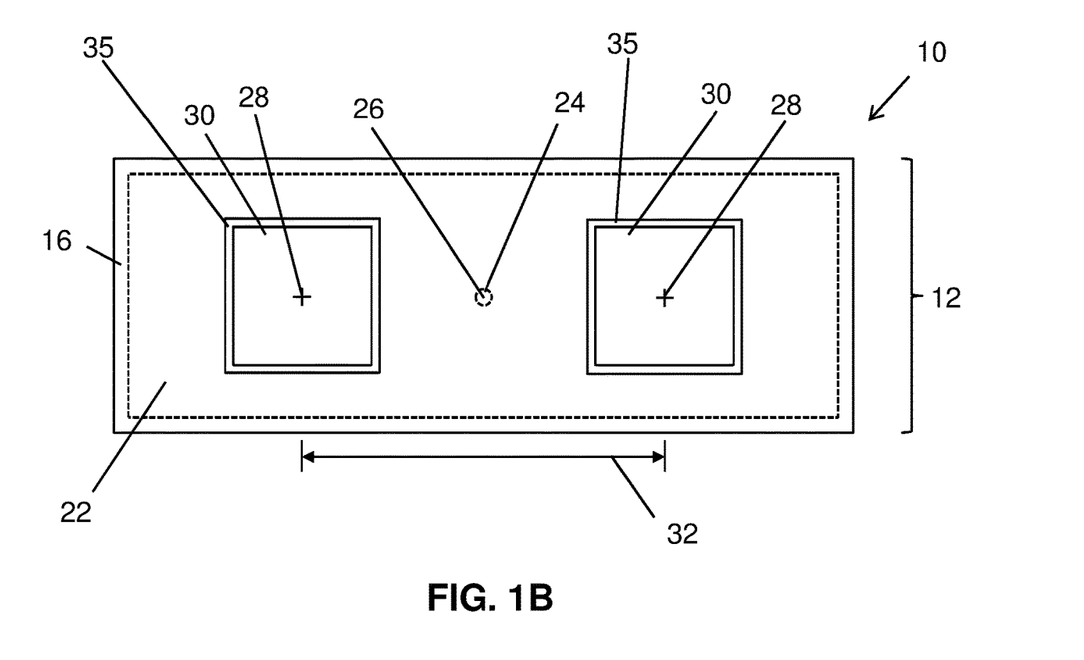

FIGS. 1A-B show a side and top view of an embodiment of a device (10) for the thermal treatment of test samples. As shown in FIG. 1A the device (10) for the thermal treatment of test samples comprises a sample holder (12) and one or more thermoelectric elements (14). The sample holder (12) comprises a hollow body (16) with an inner bottom surface (18) and an inner top surface (20) opposite to each other. The one or more thermoelectric elements (14) are in thermal contact with the hollow body (16). In the shown embodiment the inner bottom surface (18) and the inner top surface (20) of the hollow body (16) are parallel to each other. The hollow body (16) comprises an internal working fluid (not shown). The sample holder (12) further comprises an outer top surface (22) which is parallel to the inner top surface (20). In the shown embodiment the outer top surface (22) is comprised by the hollow body (16). The inner bottom surface (18) and the inner top surface (20) are connected to each other with a pillar (24) extending along a vertical axis (26) perpendicular to the inner bottom surface (18). As shown in FIG. 1A and FIG. 1B the outer top surface (22) comprises two holding positions (28). The holding positions (28) are indicated with cross shaped position markers in FIG. 1B. Each holding position (28) is configured to hold a test sample consumable (30). In the shown embodiment, the outer top surface (22) comprises a placing area (36) at each of the at least two holding positions (28). And each placing area (36) is configured to receive, accommodate, and release a test sample consumable (30) in a manner that heat exchange between the sample holder (22) and the test sample consumable (30) can be facilitated. The placing area (36) may have a flat surface with protrusions forming a frame (35) for an accurate and reliable placing of test sample consumables (30), e.g. a test sample carrier such as a quadratic microscope slide. As further shown in FIGS. 1A and 1B the vertical axis (26) is substantially in the middle of the distance (32) between the at least two holding positions (28).

Figure 2A:
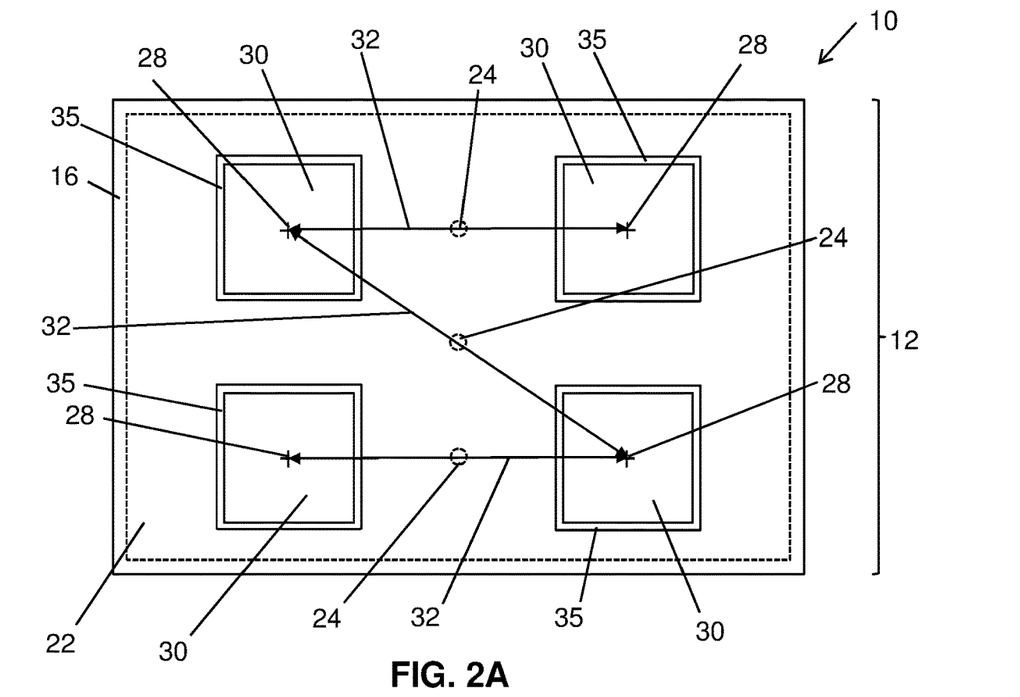
FIGS. 2A-2B depict further embodiments of a device for the thermal treatment of test samples according to the present disclosure.

FIG. 2A-B depict top views of further embodiments of a device (10) for the thermal treatment of test samples. The outer top surface (22) of the hollow body (16) of the sample holder (12) as shown in FIG. 2A comprises four holding positions (28) as indicated with four cross shaped position markers. Needless to say, the number of holding positions may vary depending on the number of test samples to be analyzed simultaneously. The outer top surface (22) of the hollow body (16) comprises four placing areas at each of the four holding positions (28). The placing areas may have a flat surface with protrusions forming a frame (35) for an accurate and reliable placing of test sample consumables (30), e.g. a quadratic test sample carrier such as a quadratic microscope slide. As further shown on FIG. 2A, the hollow body (16) of the sample holder (12) comprises three pillars (24). Each pillar (24) is substantially in the middle of the distance (32) between at least two holding positions (28).

Figure 2B:
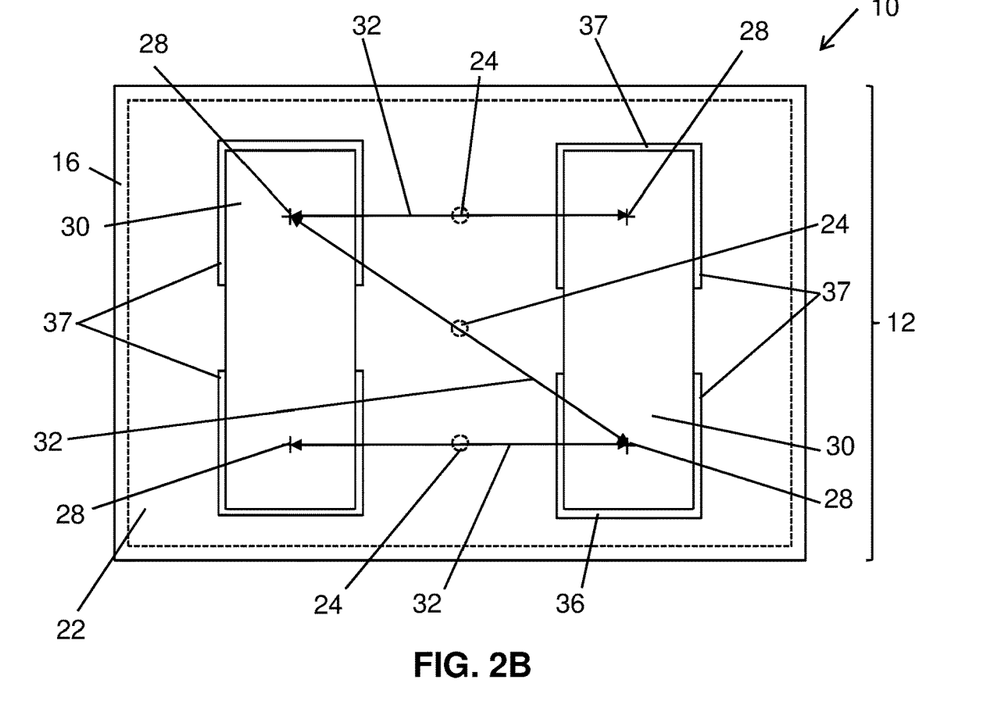

Alternatively, as shown in FIG. 2B, each holding position (28) is configured to hold a part of a test sample consumable (30). The outer top surface (22) of the hollow body (16) of the sample holder (12) as shown in FIG. 2B comprises four holding positions (28) as indicated with four cross shaped position markers. And the outer top surface (22) of the hollow body (16) comprises four placing areas at each of the four holding positions (28). The protrusions of two placing areas may form a common frame (37) for the accurate and reliable placing of a test sample consumable (30), e.g. a rectangular test sample carrier such as a rectangular microscope slide. As further shown on FIG. 2B, the hollow body (16) of the sample holder (12) comprises three pillars (24). Each pillar (24) is substantially in the middle of the distance (32) between at least two holding positions (28).

Figure 3A:
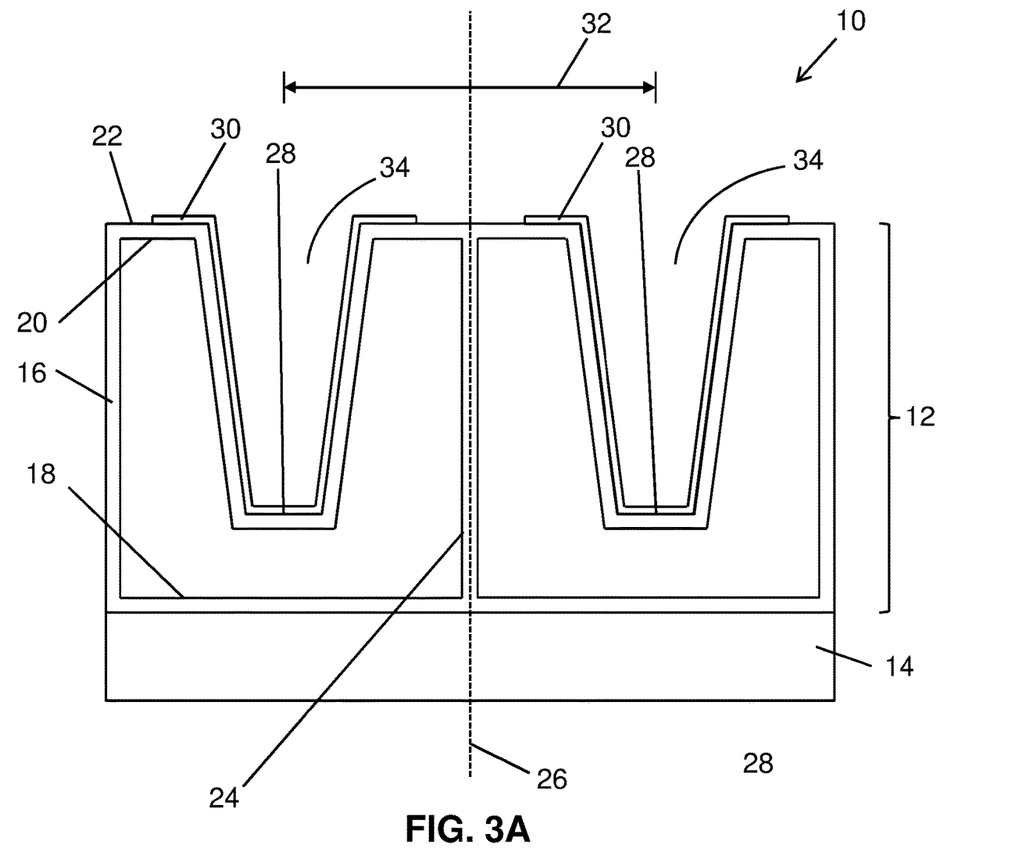
FIGS. 3A-3B show another embodiment of a device for the thermal treatment of test samples according to the present disclosure.
Figure 3B:
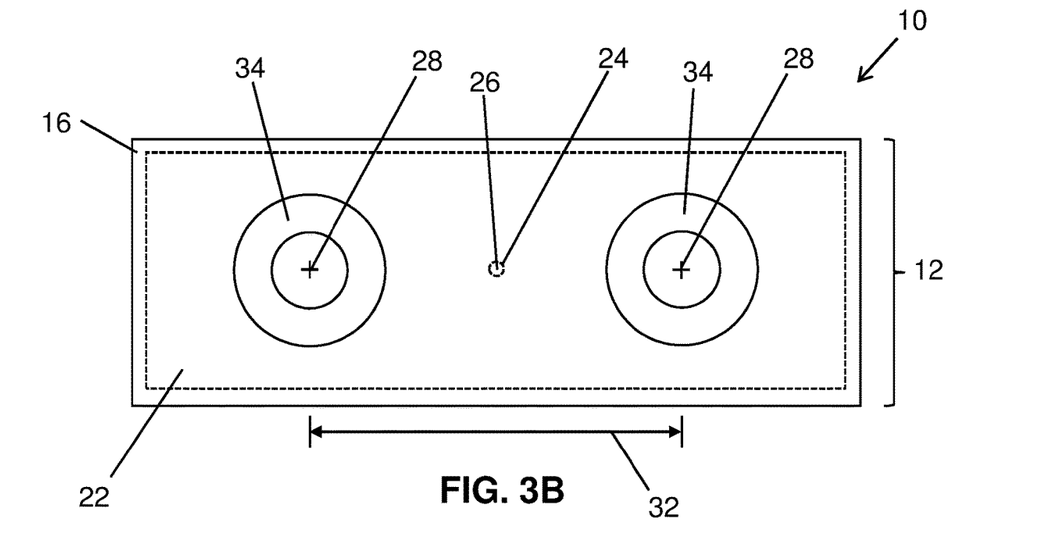

FIG. 3A-B show a side and top view of a further embodiment of a device (10) for the thermal treatment of test samples comprising a sample holder (12) and one or more thermoelectric elements (14). The sample holder (12) comprises a hollow body (16) with an inner bottom surface (18) and an inner top surface (20) opposite to each other as shown in FIG. 3A. The one or more thermoelectric elements (14) are in thermal contact with the hollow body (16). The hollow body (16) comprises an internal working fluid (not shown). The sample holder (12) further comprises an outer top surface (22) which is parallel to the inner top surface (20). In the shown embodiment the outer top surface (22) is comprised by the hollow body (16). The inner bottom surface (18) and the inner top surface (20) are connected to each other with a pillar (24) extending along a vertical axis (26) perpendicular to the inner bottom surface (18). As shown in FIG. 3A the outer top surface (22) comprises two holding positions (28) each configured to hold a test sample consumable (30). In FIG. 3B the two holding positions (28) are indicated with two cross shaped position markers and the test sample consumable is not shown. In the shown embodiment, the outer top surface (22) comprises a conical recess (34) at each of the at least two holding positions (28). And each conical recess is configured to receive, accommodate, and release a test sample consumable (30), e.g. a conical test sample vessel. As further shown in FIG. 3A and FIG. 3B, the vertical axis (26) is substantially in the middle of the distance (32) between the at least two holding positions (28).

Figure 4:
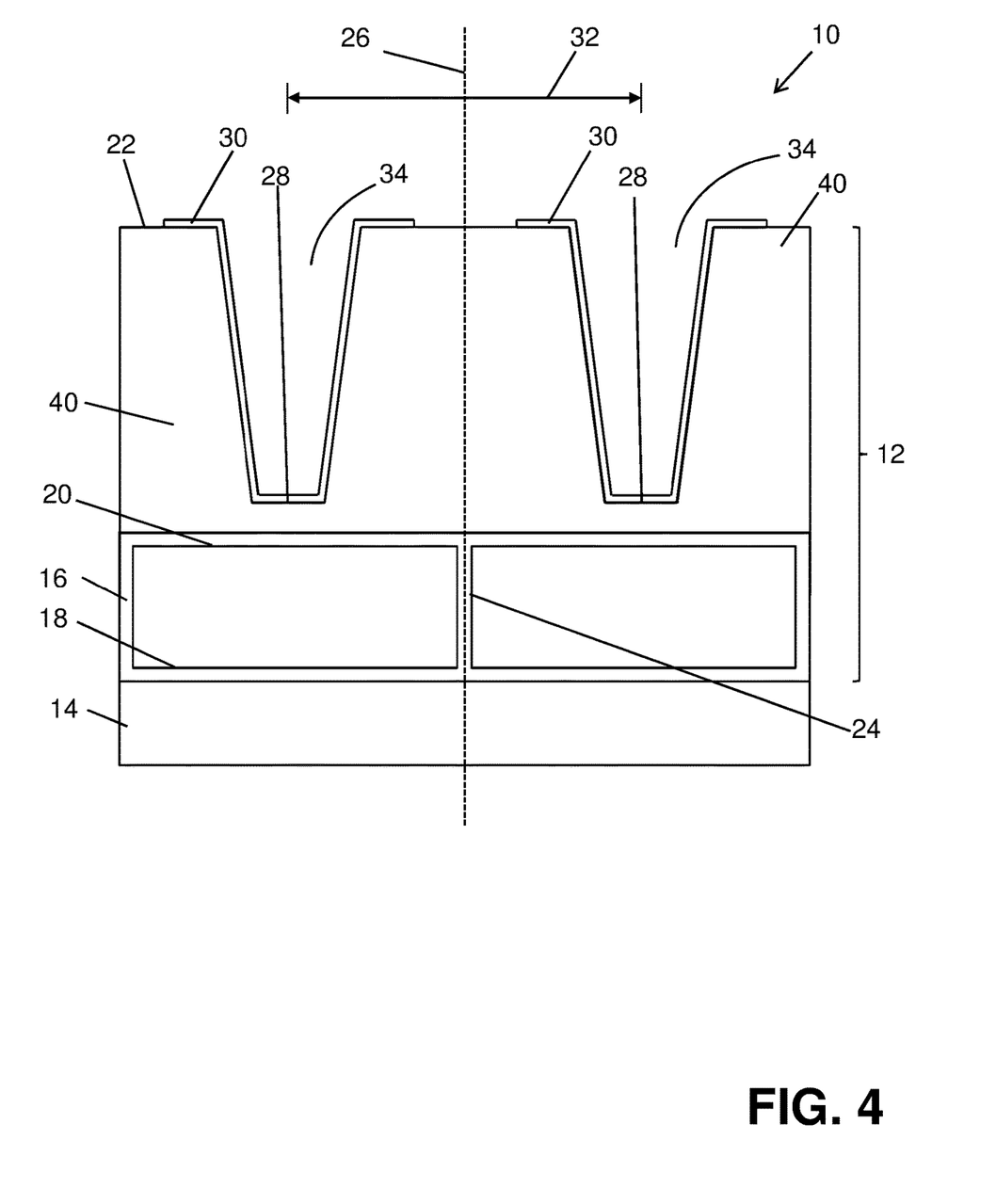
FIG. 4 shows an additional embodiment of a device for the thermal treatment of test samples according to the present disclosure.

FIG. 4 depicts a further embodiment of a device (10) for the thermal treatment of test samples comprising a sample holder (12) and one or more thermoelectric elements (14). The sample holder (12) comprises a thermal block (40) and a hollow body (16). The outer top surface (22) of the sample holder (12) is comprised by the thermal block (40). As shown in FIG. 4 the outer top surface (22) comprises two holding positions (28) each configured to hold a test sample consumable (30). In the shown embodiment, the outer top surface (22) comprises a conical recess (34) at each of the at least two holding positions (28). And each conical recess (34) is configured to receive, accommodate, and release a test sample consumable (30), e.g. a conical test sample vessel. Alternatively, the outer top surface (22) may comprises a placing area at each of the at least two holding positions (28). And each placing area is configured to receive, accommodate, and release a test sample consumable or a part of a test sample consumable, e.g. a test sample carrier such as a microscope slide as shown in in FIG. 1A. The hollow body (16) is substantially planar and the thermal block (40) is located on the hollow body (16). The hollow body (16) comprises an inner bottom surface (18) and an inner top surface (20) opposite and parallel to each other and connected to each other with a pillar (24) extending along a vertical axis (26) perpendicular to the inner bottom surface (18). As further shown in FIG. 4 the vertical axis (26) is substantially in the middle of the distance (32) between the at least two holding positions (28).

Figure 5A:
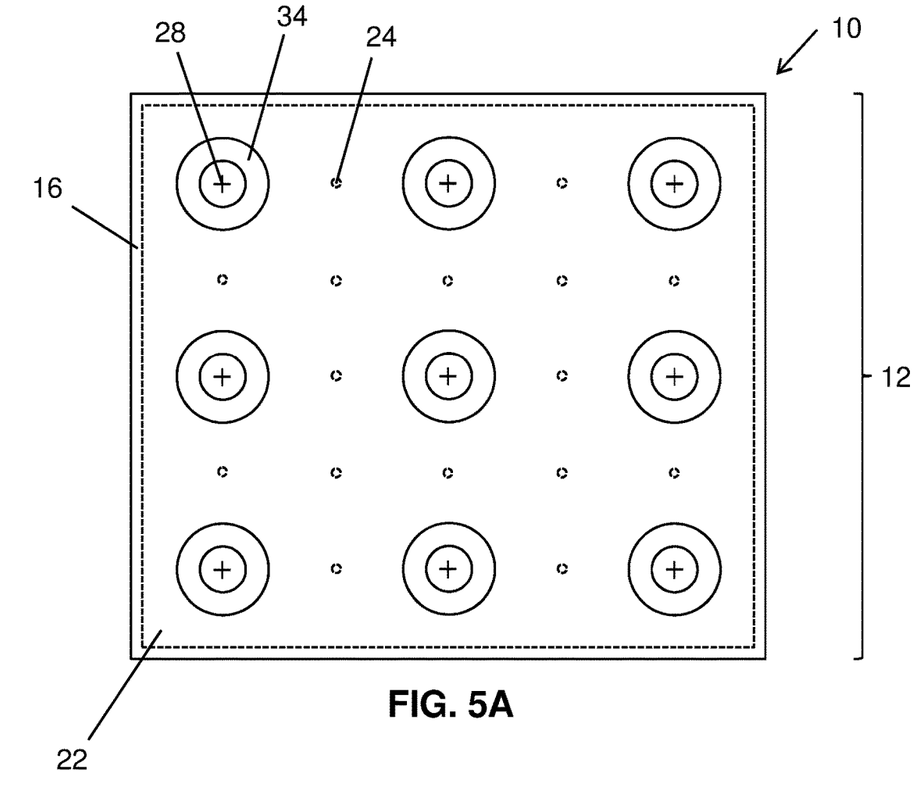
FIGS. 5A-5B depict further embodiments of a device for the thermal treatment of test samples according to the present disclosure.

FIG. 5A-B show top views of further embodiments of a device (10) for the thermal treatment of test samples according to the present disclosure. The outer top surface (22) of the hollow body (16) of the sample holder (12) as shown in FIG. 5A comprises nine holding positions (28) as indicated with nine cross shaped position markers. Needless to say, the number of holding positions may vary depending on the number of test samples to be analyzed simultaneously. Thus, the sample holder may comprise more than nine holding positions, for example 96 or 384 or 1536 holding positions. The shown outer top surface (22) of the hollow body (16) comprises nine recesses (34) at each of the nine holding positions (28). The recesses may have a conical shape configured to receive, accommodate, and release a test sample consumable, e.g. a conical test sample vessel (not shown). Alternatively, the nine recesses may be configured to receive, accommodate, and release a multi test sample vessel assembly such as a multiwell plate. As further shown on FIG. 5A, the hollow body (16) of the sample holder (12) comprises sixteen pillars (24). And each pillar (24) is substantially in the middle of the distance between at least two holding positions (28).

Figure 5B:
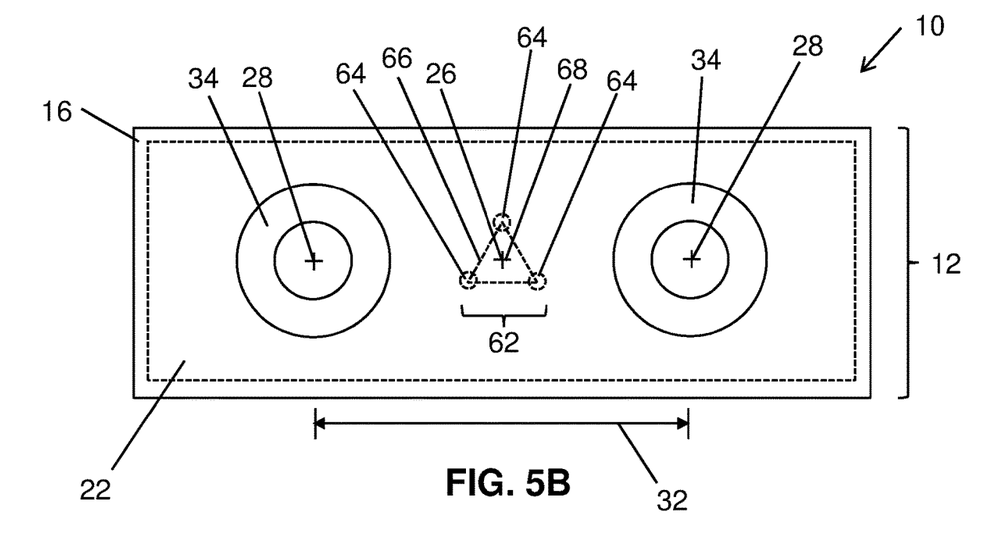

As shown in FIG. 5B, the pillar may be an assembly (62) of two or more sub-pillars (64). In the shown embodiment, the assembly (62) comprises three sub-pillars (64). The inner bottom surface and the inner top surface of the hollow body (16) are connected to each other by each of the three sub-pillars (64) of the assembly (62). The shown assembly (62) comprises a horizontal triangle circumference (66). The assembly comprises a further vertical axis perpendicular to the inner bottom surface (18) and in the center (68) of the horizontal circumference (66). The three sub-pillars (64) may be arranged in an equidistant manner along the horizontal triangle circumference (66) of the assembly (62), e.g. at each corner of the horizontal triangle circumference (66).

Figure 6A:
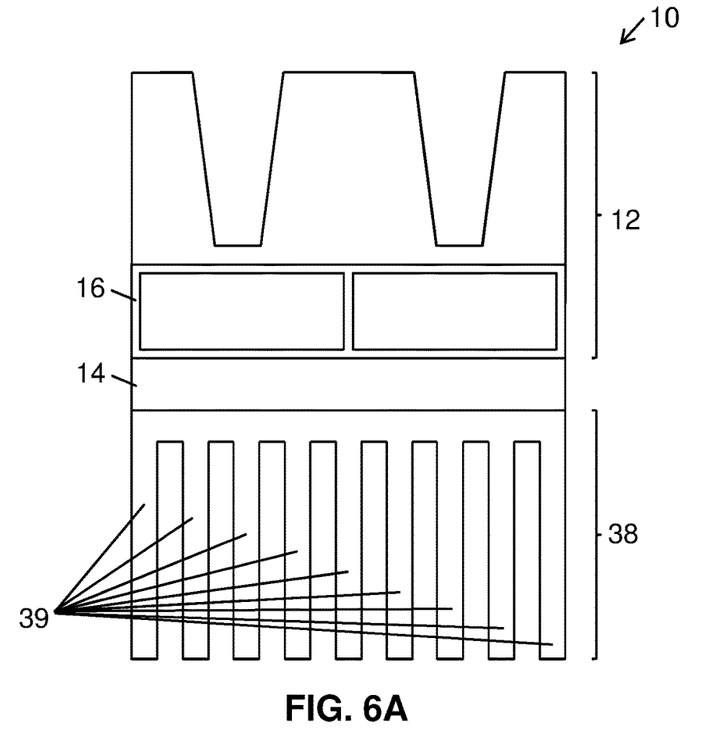
FIGS. 6A-6B show additional embodiments of a device according to the present disclosure
Figure 6B:
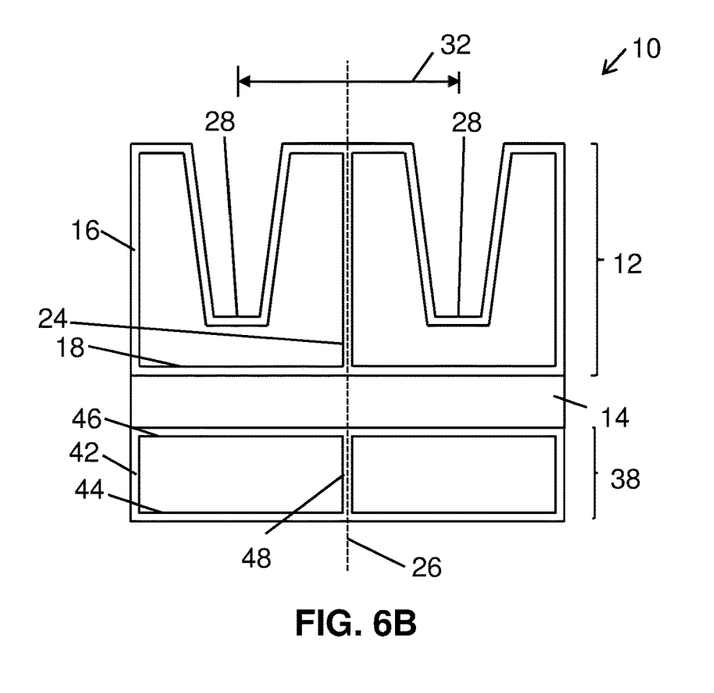

FIG. 6A-B depicts further embodiments of a device (10) for the thermal treatment of test samples. The device (10) as shown in FIG. 6A comprises a sample holder (12) as described in FIG. 4 in more detail. Alternatively, the device (10) may comprise a sample holder (12) as described in FIG. 1A or FIG. 3A. The device (10) comprises one or more thermoelectric elements (14) which is in thermal contact with the hollow body (16) of the sample holder (12). The device (10) may further comprise a heat sink (38) which is in thermal contact with the one or more thermoelectric elements (14). And the one or more thermoelectric elements (14) are disposed between the hollow body (16) of the sample holder (12) and the heat sink (38). The heat sink (38) may comprise fins (39) which are evenly distributed across the heat sink (38). As shown in FIG. 6B, the heat sink (38) may be a further hollow body (42). The further hollow body (42) may comprise a further inner bottom surface (44) and a further inner top surface (46) opposite and parallel to each other. The further hollow body comprises a further internal working fluid (not shown). The further inner top surface (46) and the further inner bottom surface (44) of the further hollow body (42) may be connected to each other with a further pillar (48). In the shown embodiment, the pillar (24) of the hollow body (16) and the further pillar (48) of the further hollow body (42) extend along the same vertical axis (26) perpendicular to the inner bottom surface (18) of the hollow body (16) and the inner bottom surface (44) of the further hollow body (42). As further shown, the vertical axis (26) is substantially in the middle of the distance (32) between the at least two holding positions (28). Alternatively, the further pillar (48) may extend along a different vertical axis perpendicular to the inner bottom surface (44) of the further hollow body (42). For example, a further pillar (48) may extend along a vertical axis perpendicular to the inner bottom surface (44) and substantially at a holding position (28). The one or more thermoelectric elements (14) are disposed between the hollow body (16) of the sample holder (12) and the further hollow body (42) of the heat sink (38). The device (10) as shown in FIG. 6B comprises a sample holder (12) as described in FIG. 3A in more detail. Alternatively, the device (10) as shown in FIG. 6B may comprise a sample holder (12) as described in FIG. 1A or FIG. 4.

Figure 7:
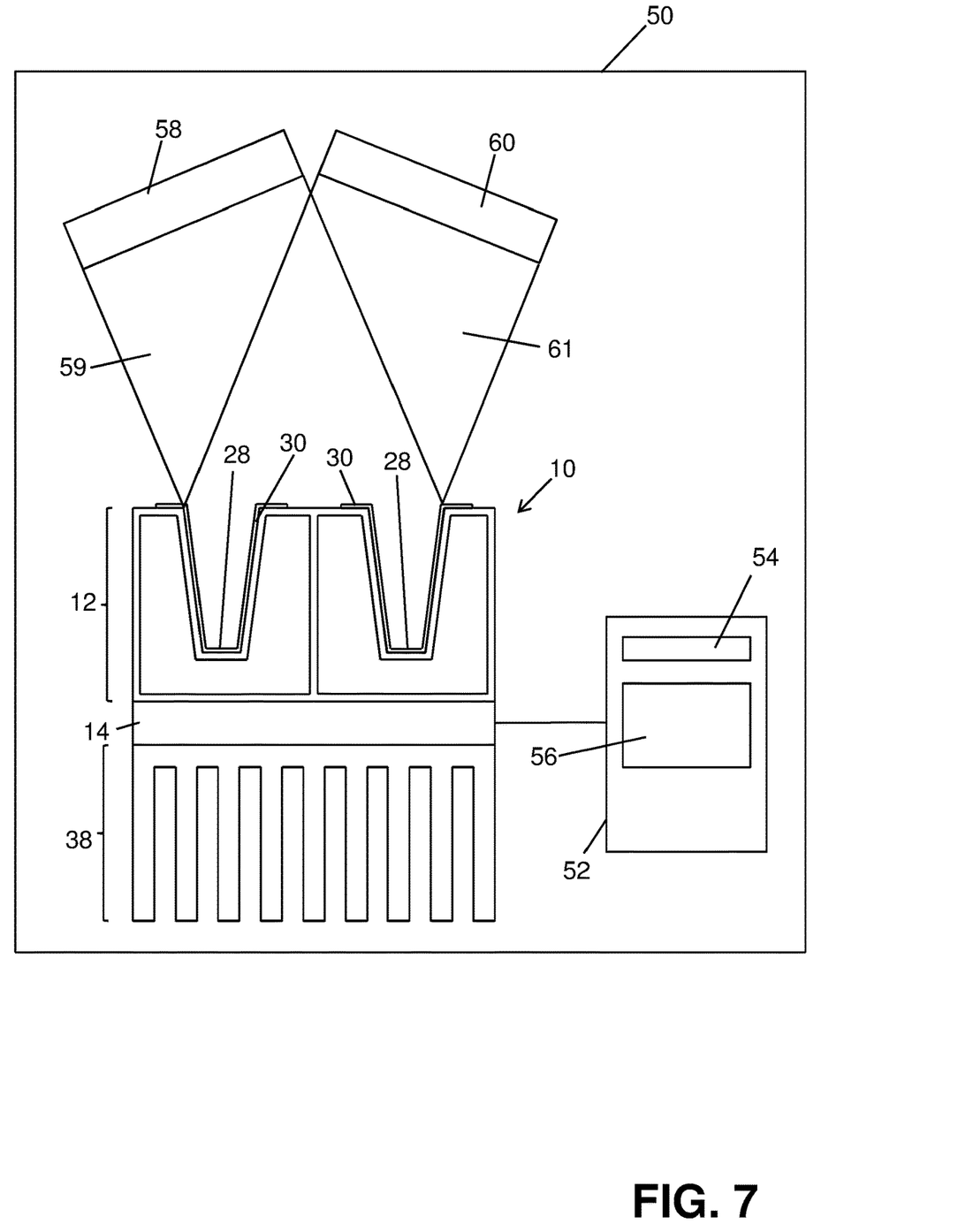
FIG. 7 shows an embodiment of a laboratory instrument according to the present disclosure.

In FIG. 7 a schematic representation of a laboratory instrument (50) for performing thermal treatment of test samples is shown. The laboratory instrument (50) comprises a device (10) for the thermal treatment of test samples and a control device (52). The device (10) for the thermal treatment of test samples comprises at least a sample holder (12) and one or more thermoelectric elements (14) as further described in FIG. 1 to FIG. 5. The device (10) for the thermal treatment of test samples may further comprise a heat sink (38) as further described in FIG. 6. The control device (52) is configured to control the one or more thermoelectric elements (14) in order to heat or cool the sample holder (12) of the device (10). The control device (52) is communicatory connected to the one or more thermoelectric elements (14) for controlling the one or more thermoelectric elements (14). The control device (52) further comprises a processor (54) and a computer-readable medium (56) having stored thereon a computer program product comprising instructions to control the one or more thermoelectric elements (14) in order to heat or cool the sample holder (12) to at least one predefined temperature or set-point temperature of a temperature profile for a predefined time duration and at a predefined time point.

The shown laboratory instrument (50) further comprises a light source (58) configured to emit light (59) towards the at least two holding positions (28) and a detector (60) configured to detect light (61) emitted from the at least two holding positions (28). Thus, the light source (59) is configured to emit light (59) towards the at least two holding positions (28) so that a test sample in a test sample consumable (30) can be illuminated and a resulting analyte-related light emitted from the test sample can be measured by the detector (60).

While the current disclosure has been described in relation to its specific embodiments, it is to be understood that this description is for illustrative purposes only. It is therefore understood that numerous modifications may be made to the illustrative embodiments and that other arrangements may be devised without departing from the spirit or scope of the present disclosure as defined by the appended claims. Various publications are cited herein, the disclosures of which are incorporated herein by reference in their entireties.

LIST OF REFERENCE NUMBERS

10 device for the thermal treatment of test samples
12 sample holder
14 thermoelectric element
16 hollow body
18 inner bottom surface
20 inner top surface
22 outer top surface
24 pillar
26 vertical axis
28 holding position
30 test sample consumable
32 distance
34 recess
35 frame
36 placing area
37 common frame
38 heat sink
39 fins
40 thermal block
42 further hollow body
44 further inner bottom surface
46 further inner top surface
48 further pillar
50 laboratory instrument
52 control device
54 processor
56 computer-readable medium
58 light source
59 light emitted towards the at least two holding positions
60 detector
61 light emitted from the at least two holding positions
62 assembly of sub-pillars
64 sub-pillar
66 horizontal circumference of the assembly
68 center of the horizontal circumference of the assembly

The invention claimed is:

1. A device for the thermal treatment of test samples comprising a sample holder and one or more thermoelectric elements, wherein the sample holder comprises a hollow body with an inner bottom surface and an inner top surface opposite to each other, wherein the hollow body comprises an internal working fluid, wherein the sample holder further comprises an outer top surface parallel to the inner top surface, wherein the inner bottom surface and the inner top surface are connected to each other with at least one pillar extending along a vertical axis perpendicular to the inner bottom surface, wherein the outer top surface comprises at least two holding positions each configured to hold a test sample consumable or a part of a test sample consumable, wherein the vertical axis is substantially in the middle of the distance between the at least two holding positions, wherein the one or more thermoelectric element are in thermal contact with the hollow body, wherein the outer top surface comprises a recess at each of the at least two holding positions, wherein each recess is configured to receive, accommodate, and release a test sample consumable or a part of a test sample consumable in a manner that heat exchange between the sample holder and the test sample consumable can be facilitated, and wherein the at least one pillar is positioned such that it is offset from each of the recesses.

2. A device for the thermal treatment of test samples according to claim 1, wherein the pillar comprises a wick structure.

3. A device for the thermal treatment of test samples according to claim 2, wherein the wick structure is a porous structure.

4. A device for the thermal treatment of test samples according to claim 3, wherein the porous structure is made of sintered metal or sintered alloy.

5. A device for the thermal treatment of test samples according to claim 1, wherein the at least one pillar is an assembly of two or more sub-pillars, wherein the inner bottom surface and the inner top surface of the hollow body are connected to each other by each sub-pillar of the assembly, wherein the assembly comprises a horizontal circumference and a further vertical axis perpendicular to the inner bottom surface and in the center of the horizontal circumference, wherein the sub-pillars are arranged within or along the horizontal circumference of the assembly, wherein the further vertical axis is aligned with the vertical axis.

6. A device for the thermal treatment of test samples according to claim 1, wherein the hollow body is made of a first metal, first sintered metal, first alloy, or first sintered alloy, wherein the pillar is made of a second metal, second sintered metal, second alloy, or second sintered alloy, wherein the first metal, first sintered metal, first alloy, or first sintered alloy and the second metal, second sintered metal, second alloy, or second sintered alloy are the same or different.

7. A device for the thermal treatment of test samples according to claim 1, wherein the device further comprises a heat sink which is in thermal contact with the one or more thermoelectric elements.

8. A device for the thermal treatment of test samples according to claim 7, wherein the heat sink is a further hollow body.

9. A device for the thermal treatment of test samples according to claim 1, wherein the outer top surface is comprised by the hollow body, wherein the shape of the inner top surface is adapted to the outer top surface.

10. A device for the thermal treatment of test samples according to claim 1, wherein the sample holder further comprises a thermal block, wherein the outer top surface is comprised by the thermal block, wherein the hollow body is substantially planar, wherein the thermal block is located on the hollow body.

11. A device for the thermal treatment of test samples according to claim 1, wherein the hollow body and the pillar consist of one single piece, wherein said single piece is a 3D printing product.

12. A laboratory instrument for performing thermal treatment of test samples comprising a device according to claim 1 and a control device, wherein the control device is configured to control the one or more thermoelectric elements in order to heat or cool the sample holder.

13. A laboratory instrument according to claim 12, wherein the laboratory instrument further comprises a light source configured to emit light towards the at least two holding positions and a detector configured to detect light emitted from the at least two holding positions.

14. A method of performing thermal treatment on test samples in a device according to claim 1, comprising exposing a test sample to one or more predefined temperatures by operating the one or more thermoelectric elements, wherein the test sample is in a test sample consumable held by one of the at least two sample holding positions.

15. A method of performing thermal treatment on test samples in a device according to claim 12, comprising exposing a test sample to one or more predefined temperatures by operating the one or more thermoelectric elements, wherein the test sample is in a test sample consumable held by one of the at least two sample holding positions.

* * * * *